United States Patent
Zhang et al.

(10) Patent No.: US 6,734,708 B1
(45) Date of Patent: May 11, 2004

(54) CONTROLLABLE CURRENT SOURCE CIRCUIT AND A PHASE LOCKED LOOP EQUIPPED WITH SUCH A CIRCUIT

(75) Inventors: Xiaopin Zhang, München (DE); Stefan Herzinger, München (DE); Helmut Herrmann, München (DE)

(73) Assignee: Infineon Technologies AG, Munich (DE)

(*) Notice: Subject to any disclaimer, the term of this patent is extended or adjusted under 35 U.S.C. 154(b) by 252 days.

(21) Appl. No.: 09/624,438

(22) Filed: Jul. 24, 2000

(30) Foreign Application Priority Data

Jul. 23, 1999 (DE) .......................................... 199 34 723

(51) Int. Cl.⁷ ................................................. H03I 7/06
(52) U.S. Cl. ....................... 327/156; 327/157; 327/148
(58) Field of Search ................................ 327/156, 148, 327/157, 147, 154, 155, 160, 111, 112, 563, 2, 3, 7, 8; 331/11, 25, DIG. 3; 375/373, 374, 375, 376, 25; 326/124, 126, 127, 108, 82, 89, 90, 91; 330/252, 253

(56) References Cited

U.S. PATENT DOCUMENTS

| 5,043,677 A | * | 8/1991 | Tomassetti et al. ............ 331/17 |
| 5,119,043 A | | 6/1992 | Borwn et al. ................. 311/16 |
| 5,453,680 A | | 9/1995 | Giolma et al. ............... 323/315 |
| 5,463,588 A | * | 10/1995 | Chonan ................. 365/189.09 |
| 5,465,061 A | | 11/1995 | Dufour ....................... 327/112 |
| 5,635,863 A | * | 6/1997 | Price, Jr. ....................... 327/3 |
| 5,663,686 A | | 9/1997 | Tada ............................... 331/8 |
| 5,722,052 A | | 2/1998 | Abdi et al. |
| 5,770,976 A | | 6/1998 | Nagaraj |
| 5,812,022 A | * | 9/1998 | Hirano et al. ................ 327/563 |
| 5,939,949 A | * | 8/1999 | Olgaard et al. ............. 331/1 A |
| 6,195,306 B1 | * | 2/2001 | Horiguchi et al. .......... 365/226 |
| 6,256,362 B1 | * | 7/2001 | Goldman ..................... 375/373 |

FOREIGN PATENT DOCUMENTS

| DE | 199 52 867 A1 | 5/2000 |
| EP | 0 777 333 A1 | 6/1997 |
| JP | 1-128621 | 5/1989 |

OTHER PUBLICATIONS

Floyd M. Gardner: "Charge–Pump Phase–Lock Loops", IEEE Transactions on Communications, vol. COM–28, No. 11, Nov. 1990, pp. 1849–1858.

Taizo Yamawaki et al.: "A 2.7–V GSM RF Transceiver IC", IEEE Journal of Solid State Circuits, vol. 32, No. 12, Dec. 1997, pp. 2089–2096.

* cited by examiner

*Primary Examiner*—Linh M. Nguyen
(74) *Attorney, Agent, or Firm*—Laurence A. Greenberg; Werner H. Stemer; Ralph E. Locher

(57) ABSTRACT

A controllable current source circuit and a phase locked loop contained such a circuit are disclosed. The current source circuit such a single switched driver stage for a switched actuation of the loop filter. A continuously switched-on driver stage is introduced into one of several paths of the current source circuit, so that a continuously weaker current is drawn by the loop filter. The currents are preferably stabilized via a current mirror circuit.

16 Claims, 1 Drawing Sheet

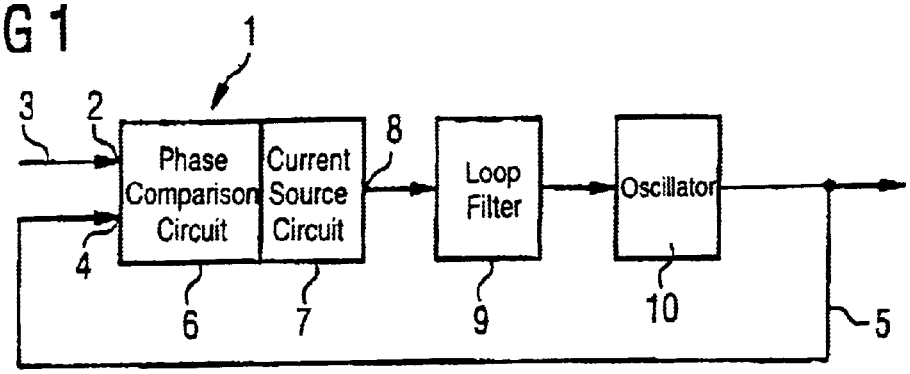
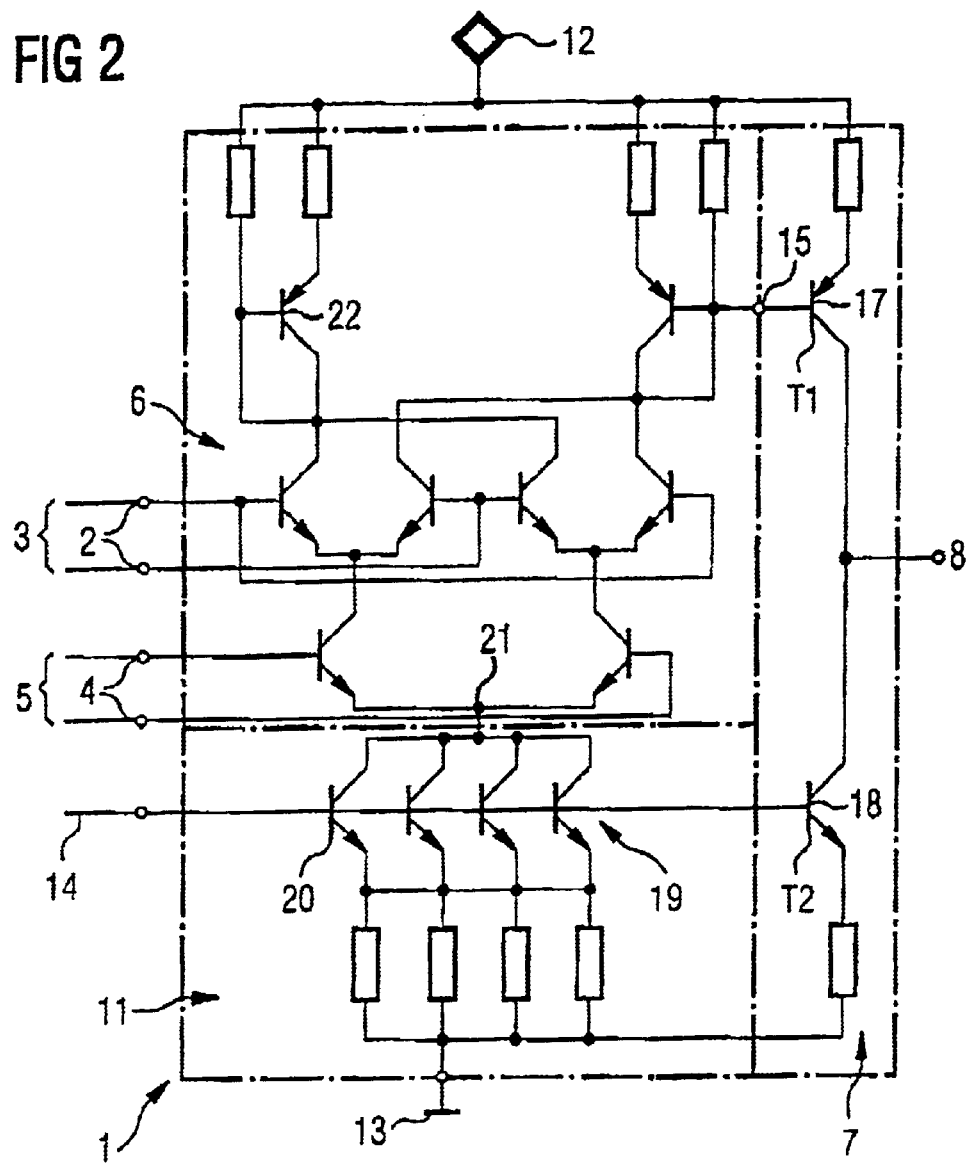

US 6,734,708 B1

CONTROLLABLE CURRENT SOURCE CIRCUIT AND A PHASE LOCKED LOOP EQUIPPED WITH SUCH A CIRCUIT

BACKGROUND OF THE INVENTION

Field of the Invention

The invention relates to a current source circuit and phase locked loop equipped with such a circuit, by means of which the phase angle of an output signal is controlled with respect to the phase angle of a reference signal, if required with a desired phase offset.

The general design of such phase locked loops is known from "IEEE Transactions on Communications", Vol. COM-28, No. 11, November 1980: "Charge-Pump Phase-Lock Loops" by F. M. Gardner, pages 1849 to 1858, where a current source circuit (charge pump) is connected between the outputs of a phase detector and a loop filter which controls an oscillator and contains a capacitance, and this current source circuit feeds the loop filter with current or draws current from the loop filter depending on the respective phase comparison result.

The general design of such phase locked loops is also known from "IEEE Journal of Solid-State Circuits": "A 2.7-V GSM RF Transceiver IC", Yamawaki et al, Vol. 32, No. Dec. 12, 1997, pages 2089–2096, in which the output signal of the oscillator whose phase is to be controlled is applied, after mixing with the local signal, to the phase comparator, to whose other input a reference signal in the form of an intermediate frequency signal is applied. A current source circuit is connected between the output of the phase comparator and the loop filter which actuates the oscillator, and this current source circuit contains transistor switches in the same way as in the document already discussed, which switch the current supply of the loop filter as a function of the respective phase angle, so that the loop filter capacitance is either charged or discharged. However, the switching of the driver transistors (charge pumps) is in each case associated with switching interference signals so that the overall signal-to-noise ratio deteriorates owing to the switching processes carried out by the driver transistors. In addition, the required circuit complexity is rather high owing to the switching transistors and their circuitry.

SUMMARY OF THE INVENTION

The invention is based on the object of providing a current source circuit, in particular for a phase locked loop, in which the number of switching processes is reduced, and the signal-to-noise ratio is thus improved.

This object is achieved by the features cited in patent claim 1. Furthermore, a phase comparator is provided, according to claim 7. Advantageous refinements of the invention are specified in the dependent claims.

Only a single switch is now provided in the current source circuit according to the invention, which is switched as a function of a control signal, for example the phase comparison result, and either charges or discharges the component connected on the output side, for example a loop filter. The other function, that is to say the discharging or the charging of the component, is carried out by a continuously switched-on driver transistor. In consequence, this driver transistor does not carry out any switching processes and thus produces no switching noise. The total switching noise produced is thus reduced, and the signal-to-noise ratio is improved. The circuit also provides the advantage that the component which produces the control signal, for example the phase comparison circuit, now need be equipped with only a single output, to which the driver switch is connected, being switched as a function of the control signal, for example the phase comparison result. The required circuit and wiring complexity is thus also reduced at the same time.

The continuously switched-on driver stage is preferably designed in such a way that it carries a current which differs from the current carried by the switched driver stage when it is switched on. This results in a net current difference which acts as a bias current and is used for frequency coverage during a search and lock-on process. In consequence, the circuit design is even further simplified. Yet another simplification can be achieved by the continuously switched-on driver stage being part of a current mirror circuit into which a desired stabilized current flows. This current mirror circuit is preferably also connected to the phase comparison circuit and causes a stabilized current to flow into it.

The total number of circuits and control components required is thus reduced, so that temperature drift problems, matching problems and the like are also reduced. Good circuit characteristics are thus ensured.

The invention will be explained in more detail in the following text using an exemplary embodiment and with reference to the drawings, in which:

BRIEF DESCRIPTION OF THE DRAWINGS

FIG. 1 shows a schematic illustration of a phase locked loop having a current source circuit designed according to the invention, and FIG. 2 shows a block diagram of an exemplary embodiment of the phase comparator designed according to the invention.

DESCRIPTION OF THE PREFERRED EMBODIMENT

As is shown in FIG. 1 the phase locked loop contains a phase comparator 1 to one input 2 of which a reference signal 3 is applied. An input signal whose phase angle is to be controlled, in this case the possibly frequency-converted output signal 5 from a voltage-controlled oscillator 10, is applied to the other input 4 of the phase comparator 1. The phase comparator 1 comprises a phase comparison circuit 6 and a current source circuit 7 (driver or charge pump stage) and, via its output 8, emits the output signal to a loop filter 9, whose capacitance is charged or discharged depending on the phase comparator output signal. The loop filter 9 controls the oscillator 10 which produces the output signal 5, whose phase is locked to the reference signal 3.

FIG. 2 shows a block diagram of the phase detector 1, which comprises three functional blocks: the phase comparison stage 6, the current source circuit 7 and a current mirror circuit 11. The phase comparator 1 is connected between a supply voltage connection 12 and a ground potential connection 13. The phase comparison stage 6 contains a switching element which switches between two output states, for example a JK flipflop or, as shown in FIG. 2, an exclusive-OR gate with the symmetrical design shown, to whose input connections 2, 4 the two signals 3, 5 to be compared with one another are applied via the lines shown, and which is connected to the supply voltage connection 12 via the illustrated switching transistors and emitter negative feedback and depletion resistors. The phase comparison stage 6 has only a single output 15 which is switched to either a high potential or a low potential depending on the phase angle. One switching state corresponds, for example, to the reference signal leading the signal to be measured, while the other state is assumed when the phase is lagging.

The phase comparison stage output 15 is connected to the current source circuit 7, which is designed as a switched charge pump and comprises a switching transistor 17 whose base is connected to the connection 15 and which, when switched on, feeds current to the phase comparator output 8, so that the capacitance of the loop filter 9 is charged.

In order to discharge the loop filter capacitance, the current source circuit 7 contains a continuously operated drive stage, which is connected between the output connection 8 and ground potential 13, in the form of a transistor 18 through which a constant discharge current flows.

The transistor 18 can be provided with its own control circuit for stabilization of the current flowing through it, but is preferably a component of a current mirror circuit 19 having a plurality of transistors 18, 20 whose bases and emitters are each connected to one another in a manner known per se. The base connection of the current mirror circuit 19 is connected to an input connection 14 to which, for example, the primary side of the current mirror circuit 19 is connected. In this case, the collector and the base of the transistor on the primary side are connected to the connection 14 and to a current source which causes the desired stabilized current to flow. The emitter of this transistor is connected to the connection 13 via an emitter resistor, analogous to the circuitry of the transistors 18, 20. The external current feed means that it is simple to change and adjust the respective current level that is stabilized in the current mirror circuit 19. The primary side of the current mirror circuit may also, of course, be designed as part of the current source circuit 7, on the same chip.

As can be seen from FIG. 2, the collectors of a plurality of transistors 20 are jointly connected to one connection 21 of the phase comparison stage 6, so that the current mirror circuit 19 is also used for current control of the current flowing in the phase comparator. The illustrated quadruple arrangement of the transistors 20 results in a stabilized current being caused to flow in the phase comparison circuit 6 which is four times as great as the discharge current which flows continuously through the transistor 18. This current is also caused to flow into the output stage, which is connected to the output 15, of the phase comparison circuit 6, provided this path is switched on on the basis of the phase angle at that time. This output stage forms a current mirror circuit with the transistor 17, so that when it is switched on, the transistor 17 carries this current increased by a factor of four and feeds it to the connection 8. The transistor 18 draws one quarter of this current increased by a factor of four so that, effectively, a charging current is fed to the output 8 which is three times as great as the discharge current carried away via the transistor 18 when the transistor 17 is switched off.

The circuit arrangement can also be reversed in such a way that the transistor 17 is continuously switched on and feeds charging current continuously to the loop filter 9. In this case, the transistor 18 represents the switched current source, whose current connection is connected to the connection 15. In this case, the connection 15 is preferably connected to the base of the transistor 22 shown in FIG. 2 while, in contrast, the transistor 17 forms a part of the current mirror circuit 19. In this case as well, the phase comparison circuit 6 need have only a single output connection, and only one current source (transistor) is switched, so that the circuit and wiring complexity is low and the switching noise caused by the switching processes is reduced. Furthermore, no inverter is required to invert the potential at the output connection 15 in order to control a second transistor.

In general, in the case of phase detectors whose output state can be represented, as in the present case, by an output signal, it can be said that the current supply to the loop filter can be expressed as follows:

$$I = Q \cdot I_{sc} - (1-Q) \cdot I_{dc} + I_b.$$

In this case, Q denotes the output state of the phase detector which may be either 1 or 0; $I_{sc}$ denotes the source charge pump current, that is to say the charging current; $I_{dc}$ denotes the drain charge pump current, that is to say the discharge current; and $I_b$ denotes a bias current, which is fixed at a constant value. This equation can be rewritten as follows:

$$I = Q \cdot (I_{sc} + I_{dc}) + (I_b - I_{dc}).$$

This equation means that, with regard to the invention, it is possible to operate with a single switched charge pump, which carries the current $(I_{sc}+I_{dc})$ when switched on, in conjunction with an unswitched constant current source which carries a fixed constant bias current $(I_b-I_{dc})$. In this case, the same result is achieved in terms of charge as with two switched charge pumps with an additional bias current. For the exemplary embodiment shown in FIG. 2, in which the emitter current carried continuously and constantly by the transistor 18 is one quarter of the charge pump current provided by the charge pump 16, this gives the following result for the current flow to and from the loop filter 9:

$$I = Q \cdot I_c - I_c/4 = Q \cdot I_c/2 - (1-Q)I_c/2 + I_c/4.$$

With regard to the currents carried, the illustrated circuit is thus equivalent to the conventional circuit, in which two switched charge pumps are used with a current of $I_c/2$ and an additional fixed, constant bias current of $I_c/4$. As is known, the function of this bias current is to produce the frequency shift during the search and lock-on process.

What is claimed is:

1. A controllable current source circuit, comprising:
   an output;
   a supply voltage terminal and a reference potential terminal;
   a connection node;
   a first driver stage having a first controlled path containing a first transistor and a second driver stage having a second controlled path containing a second transistor having a control terminal, said first and second controlled paths connected in series between said voltage supply terminal and said reference potential terminal, and said second driver stage forming a part of a first current mirror circuit causing a constant stabilized current to flow in said second driver stage only said first driver stage switching on and off in dependence on an input signal, and said second driver stage being switched on and carrying a stabilized current;
   at least two current paths connected between said connection node and said reference potential terminal, each of said at least two current paths including a further transistor having a respective control terminal, said control terminals of said further transistors being connected to said control terminal of said second transistor;
   a phase comparator stage being connected between said connection node and said voltage supply terminal and including a switching element and at least two current paths connecting said switching element to said voltage supply terminal; and a second current mirror circuit having a primary side and a secondary side;

one of said current paths of said phase comparator stage including said primary side of said second current mirror circuit; and said secondary side of said second current mirror circuit including said first transistor.

2. The current source circuit according to claim 1, wherein said first driver stage forms a part of a current mirror circuit receiving a flow of a stabilized current when said first driver stage is switched on.

3. The current source circuit according to claim 1, wherein said current mirror circuit is coupled to a current mirror circuit connected to said first driver stage and causes a current to flow in said current mirror circuit connected to said first driver stage.

4. The current source circuit according to claim 3, wherein said second driver stage includes:

a circuit node;

a control electrode;

a first and a second current path connected between said supply voltage terminal and said circuit node;

one of said first and said second current paths forming a part of said current mirror circuit connected to said first driver stage; and a transistor connected between said circuit node and said reference potential terminal, said transistor having a transistor control electrode connected to said control electrode of said second driver stage.

5. The current source circuit according to claim 1, wherein a current carried by said first driver stage when said first driver stage is switched on is greater than a current carried by said second driver stage.

6. The current source circuit according to claim 5, wherein the current carried in said first driver stage is multiple times greater than the current carried by said second driver stage.

7. The current source circuit according to claim 5, wherein the current carried in said first driver stage is four times greater than the current carried by said second driver stage.

8. A phase locked loop, comprising:

a phase comparator having a phase comparison circuit with a reference signal input for receiving a reference signal and an input for receiving an input signal whose phase angle is to be regulated, and having a controllable current source circuit according to claim 1 on an output side of said phase comparator;

a loop filter connected to said current source circuit and having an output for outputting an output signal controlling the phase angle of the input signal.

9. The phase locked loop according to claim 8, wherein said phase comparison circuit contains a comparator configured to switch between two output states and having a single output terminal connected to said current source circuit.

10. The phase locked loop according to claim 8, wherein said phase comparison circuit contains an exclusive-OR gate.

11. The phase locked loop according to claim 8, which comprises a current mirror circuit connected to said phase comparison circuit for stabilizing a current flowing into said phase comparison circuit and into said second driver stage.

12. The phase locked loop according to claim 8, wherein said first driver stage of said controllable current source circuit forms a part of a current mirror circuit receiving a flow of a stabilized current when said first driver stage is switched on.

13. The phase locked loop according to claim 8, wherein said current mirror circuit of said controllable current source circuit is coupled to a current mirror circuit connected to said first driver stage and causes a stabilized current to flow in said current mirror circuit connected to said first driver stage.

14. The phase locked loop according to claim 8, wherein a current carried by said first driver stage of said controllable current source circuit when said first driver stage is switched on is greater than a current carried by said second driver stage.

15. The phase locked loop according to claim 14, wherein the current carried in said first driver stage of said controllable current source circuit is multiple times greater than the current carried by said second driver stage.

16. The phase locked loop according to claim 14, wherein the current carried in said first driver stage of said controllable current source circuit is four times greater than the current carried by said second driver stage.

* * * * *